(12) United States Patent
Oren

(10) Patent No.: US 7,065,702 B2
(45) Date of Patent: Jun. 20, 2006

(54) OUT-OF-ORDER CALCULATION OF ERROR DETECTION CODES

(75) Inventor: Amit Oren, Caesarea (IL)

(73) Assignee: Siliquent Technologies Ltd., Ramat Gan (IL)

( * ) Notice: Subject to any disclaimer, the term of this patent is extended or adjusted under 35 U.S.C. 154(b) by 620 days.

(21) Appl. No.: 10/123,024

(22) Filed: Apr. 11, 2002

(65) Prior Publication Data

US 2003/0066011 A1   Apr. 3, 2003

Related U.S. Application Data

(60) Provisional application No. 60/283,896, filed on Apr. 12, 2001.

(51) Int. Cl.
*H03M 13/09* (2006.01)
(52) U.S. Cl. ................................................ 714/807
(58) Field of Classification Search ................ 714/807

See application file for complete search history.

(56) References Cited

U.S. PATENT DOCUMENTS

| 5,410,546 | A | * | 4/1995 | Boyer et al. ................. 714/763 |
| 5,778,013 | A | * | 7/1998 | Jedwab ........................ 714/807 |
| 5,951,707 | A | * | 9/1999 | Christensen et al. ......... 714/752 |
| 6,223,320 | B1 | * | 4/2001 | Dubey et al. ................ 714/757 |
| 6,681,364 | B1 | * | 1/2004 | Calvignac et al. .......... 714/776 |

OTHER PUBLICATIONS

1. R,N, Williams, "A Painless Guide to CRC Error Detection Algorithms", Rocksoft Pty. Ltd., Hazelwood Park, Australia, 1993.

* cited by examiner

*Primary Examiner*—Stephen M. Baker
(74) *Attorney, Agent, or Firm*—Darby & Darby

(57) ABSTRACT

A method for error detection includes receiving a block of data that is divided into a plurality of sub-blocks having respective offsets within the block and processing the data in each of the sub-blocks so as to compute respective partial error detection codes for the sub-blocks. The partial error detection codes of the sub-blocks are modified responsive to the respective offsets, and the modified partial error detection codes are combined to determine a block error detection code for the block of data.

8 Claims, 4 Drawing Sheets

OUT-OF-ORDER CALCULATION OF ERROR DETECTION CODES

CROSS-REFERENCE TO RELATED APPLICATION

This application claims the benefit of U.S. Provisional Patent Application No. 60/283,896, filed Apr. 12, 2001, which is incorporated herein by reference.

FIELD OF THE INVENTION

The present invention relates generally to digital error detection, and specifically to methods and devices for computing and checking error detection codes.

COMPUTER PROGRAM LISTING

A compact disk containing a computer program listing appendix has been submitted and is part of this application. The attached compact disk CD-ROM contains a single file named "RMD3217. pdf", created on Apr. 11, 2002.

BACKGROUND OF THE INVENTION

Error detection codes are used in all sorts of digital communication applications to enable the receiver of a message transmitted over a noisy channel to determine whether the message has been corrupted in transit. Before transmitting the message, the transmitter calculates an error detection code based on the message contents, and appends the code to the message. The receiver recalculates the code based on the message that it has received and compares it to the code appended by the transmitter. If the values do not match, the receiver determines that the message has been corrupted and, in most cases, discards the message.

Cyclic redundancy codes (CRCs) are one of the most commonly-used types of error correcting codes. To calculate the CRC of a message, a polynomial $g(X)$ is chosen, having $N+1$ binary coefficients $g_0 \ldots g_N$. The CRC is given by the remainder of the message, augmented by N zero bits, when divided by $g(X)$. In other words, the CRC of an augmented message $D(X)$ is simply $D(X) \bmod g(X)$, i.e., the remainder of $D(X)$ divided by $g(X)$. There are many methods known in the art for efficient hardware and software implementation of CRC calculations. A useful survey of these methods is presented by Williams in "A Painless Guide to CRC Error Detection Algorithms" (Rocksoft Pty Ltd., Hazelwood Park, Australia, 1993), which is incorporated herein by reference.

FIG. 1 is a block diagram that schematically illustrates a rudimentary hardware-based CRC calculator 20, as is known in the art. To calculate the CRC of an input message, the message bits are passed through a sequence of one-bit registers 22. There are N registers, corresponding to the $N+1$ coefficients $g_0 \ldots g_N$ of the polynomial $g(X)$. A plurality of one-bit multipliers 24 (i.e., AND gates) are loaded with the values of coefficients $g_0 \ldots g_N$ (wherein $g_0 = g_N = 1$). At each cycle, the bit output of calculator 20 is fed back through multipliers 24, and the bit output by each multiplier is added to the bit value in the preceding shift register 22 by a one-bit adder 26. As there is no carry from one adder 26 to the next, these adders function simply as XOR gates. The last N bits output by calculator 20 after the end of the augmented input bitstream are the CRC of the message.

FIG. 2 is a block diagram that schematically illustrates a more efficient, table-based CRC calculator 30, as is also known in the art. In this case, the message is input to the calculator in words that are M bits wide, which are held successively by M-bit registers 32. A table 34, typically stored in read-only memory (ROM), receives the upper M bits output by calculator 30 at each cycle, $u(X)$, and outputs the value $(u(X) * X^M) \bmod g(X)$. Here $X^M$ corresponds to a shift left of M bits, and the $\bmod g(X)$ operation represents the remainder of the foregoing expression divided by $g(X)$. Adders 36 in this case are implemented by M-bit parallel XOR gates. The last word $u(X)$ output by calculator 30 after the end of the augmented message is the CRC of the message.

It is common in many networks, such as Internet Protocol (IP) networks, for the transmitter to break up messages into multiple segments for transmission, due to packet size limitations, for example. The messages are generated by a higher-level protocol, which calculates and appends the CRC to each message before transmission. The receiver can check the CRC only after it has received all of the segments of the message. If the segments arrive at the receiver in order, the CRC can be calculated at the receiver in simple pipeline fashion over the successive parts of the message as they arrive, and then compared to the CRC that was appended to the message at the transmitter. In IP networks, however, there is no guarantee that all of the segments will arrive in order at the receiver. Consequently, in implementations known in the art, the receiver must have sufficient buffer capacity to hold all of the segments until the entire multi-segment message has been received. Only then is it possible to arrange the segments in their proper order so as to calculate the CRC and determine whether to accept or reject the message.

In some applications, the buffer required to hold all of the message segments for CRC checking can be very large. An example of such an application is the Internet Small Computer System Interface (iSCSI) protocol, which maps SCSI information for transport over IP networks using the Transport Control Protocol (TCP). Prior to the transfer of the SCSI data, the iSCSI protocol breaks the iSCSI data into individual blocks called Protocol Data Units (PDUs), each of which is protected by its own CRC. These PDUs are subsequently broken down into units of data called TCP segments, which are commonly smaller than iSCSI PDUs. The TCP segments are then transferred over the network by TCP/IP, independently of one another.

On the receiver side, the TCP segments are collected and assembled into iSCSI PDUs and are then passed on for further iSCSI processing. In particular, the receiver must check the iSCSI CRC of every PDU that it receives, in order to confirm that the data are intact before passing the PDU on for further processing. The iSCSI protocol is intended to handle very high bandwidths (multi-gigabits/sec) and tolerate large delays (up to hundreds of milliseconds in wide-area networks). Since TCP/IP does not guarantee in-order delivery (i.e., the TCP segments may not be received in the order in which they were sent), before the receiver can verify the CRC of an iSCSI PDU, it must buffer the TCP segments until all the segments making up the PDU have been collected. To calculate CRCs of entire PDUs under these conditions, using methods known in the art, the iSCSI receiver requires a large, costly, high-speed buffer memory.

SUMMARY OF THE INVENTION

It is an object of the present invention to provide improved methods and devices for computation of error detection codes, particularly for hardware-based implementations of such computation.

It is a further object of some aspects of the present invention to provide methods and devices that reduce the amount of buffer memory required at a receiver in order to compute error detection codes of multi-segment messages received over a network.

In preferred embodiments of the present invention, multiple segments of a data block are received at a receiver in an arbitrary order, which is typically different from the order in which the segments were sent to the receiver by a transmitter. The data block includes a modulo-based error detection code, such as a CRC, which is typically contained in one of the segments. For each arriving segment, the receiver calculates a partial code, based only on the sub-block of the data that is contained in that segment. When the receiver is able to determine the offsets of the sub-blocks in the block as a whole (either immediately, or after some or all of the other blocks have arrived), it calculates a modified partial code for each of the sub-blocks, based on its respective offset. The modified partial codes are then combined, preferably by a XOR operation, in order to calculate the error detection code of the block as a whole. The receiver compares this value to the error detection code that was appended to the data block at the transmitter in order to determine whether to accept or reject the data block.

Thus, unlike implementations known in the art, preferred embodiments of the present invention avoid the need to reassemble the sub-blocks in their proper order in buffer memory before calculating the error detection code at the receiver. Rather, the receiver must only save the partial CRC of the sub-blocks, while the actual sub-block data are passed along for further processing and/or storage. Almost the entire calculation can therefore be implemented in an efficient pipeline processing architecture. The order in which the sub-blocks are received does not matter, and there is no need to wait for all of the message segments to be received before beginning the calculation. When an error is detected in the data block, the receiver simply signals the further processing or storage stage that the data in the block should be discarded.

There is therefore provided, in accordance with a preferred embodiment of the present invention, a method for error detection, including:

receiving a block of data that is divided into a plurality of sub-blocks having respective offsets within the block;

processing the data in each of the sub-blocks so as to compute respective partial error detection codes for the sub-blocks;

modifying the partial error detection codes of the sub-blocks responsive to the respective offsets; and combining the modified partial error detection codes to determine a block error detection code for the block of data.

Preferably, processing the data in each of the sub-blocks includes taking a modulo of the data, wherein taking the modulo includes computing the modulo with respect to a predetermined polynomial, so as to determine a cyclic redundancy code (CRC) of the sub-block. Most preferably, the block error detection code is equal to the CRC of the block of data computed with respect to the predetermined polynomial. Additionally or alternatively, modifying the partial error detection codes includes finding the modulo of respective offset factors for each of the sub-blocks based on the respective offsets, and multiplying the partial error detection codes by the modulo of the respective offset factors.

There is also provided, in accordance with a preferred embodiment of the present invention, a method for detecting an error in a block of data to which an error detection code has been appended, the block having been divided for transmission over a network into a sequence of sub-blocks, each of the sub-blocks at a respective offset within the block of data, the method including:

receiving the sub-blocks in an order that does not necessarily correspond to the sequence;

computing respective partial error detection codes for the sub-blocks in substantially the order in which the sub-blocks are received;

combining the partial error detection codes of the sub-blocks to determine a total error detection code of the block; and comparing the total error detection code to the appended error detection code in order to detect the error.

Preferably, receiving the sub-blocks includes receiving over the network a series of data packets containing the sub-blocks. In a preferred embodiment, receiving the series of data packets includes receiving Transport Control Protocol/Internet Protocol (TCP/IP) packets, and receiving the sub-blocks includes receiving the data in accordance with an Internet Small Computer System Interface (iSCSI) protocol. Preferably, the appended error detection code includes a cyclic redundancy code (CRC) of the block of data, and comparing the total error detection code to the appended error detection code includes verifying that the total error detection code is equal to the CRC.

There is additionally provided, in accordance with a preferred embodiment of the present invention, an error detection device, for calculating a block error detection code for a block of data that is divided into a plurality of sub-blocks having respective offsets within the block, the device including:

a sub-block code calculator, adapted to process the data in each of the sub-blocks so as to compute respective partial error detection codes for the sub-blocks;

a position adjustment circuit, adapted to modify the partial error detection codes of the sub-blocks responsive to the respective offsets; and a combiner, coupled to combine the modified partial error detection codes to determine a block error detection code for the block of data.

There is further provided, in accordance with a preferred embodiment of the present invention, a data receiver, for receiving a block of data to which an error detection code has been appended, the block having been divided for transmission over a network into a sequence of sub-blocks, each of the sub-blocks at a respective offset within the block of data, the receiver including:

a sub-block receiving circuit, which is adapted to receive the sub-blocks in an order that does not necessarily correspond to the sequence; and an error detection circuit, coupled to compute respective partial error detection codes for the sub-blocks in substantially the order in which the sub-blocks are received, to combine the partial error detection codes of the sub-blocks to determine a total error detection code of the block, and to compare the total error detection code to the appended error detection code in order to detect the error.

The present invention will be more fully understood from the following detailed description of the preferred embodiments thereof, taken together with the drawings in which:

$$D(X) = \sum_{I=0}^{F} A_I(X) \cdot X^{M_I},$$

wherein $M_I$ is the offset of each sub-block within block D. Using this expression, and taking the simple case in which D is broken into two sub-blocks A and B, it can be seen that the CRC of the complete block $D(X)$ is given by:

$$\begin{aligned}CRC(D(X)) &= D(X) \bmod g(X) = (A(X) * X^M + B(X)) \bmod g(X) \\ &= (A(X) * X^M) \bmod g(X) + B(X) \bmod g(X) \\ &= (A(X) \bmod g(X) * (X^M) \bmod g(X)) \bmod g(X) + B(X) \bmod g(X) \\ &= (CRC(A(X)) * (X^M) \bmod g(X)) \bmod g(X) + CRC(B(X))\end{aligned} \quad (1)$$

DETAILED DESCRIPTION OF PREFERRED EMBODIMENTS

Figure 3:
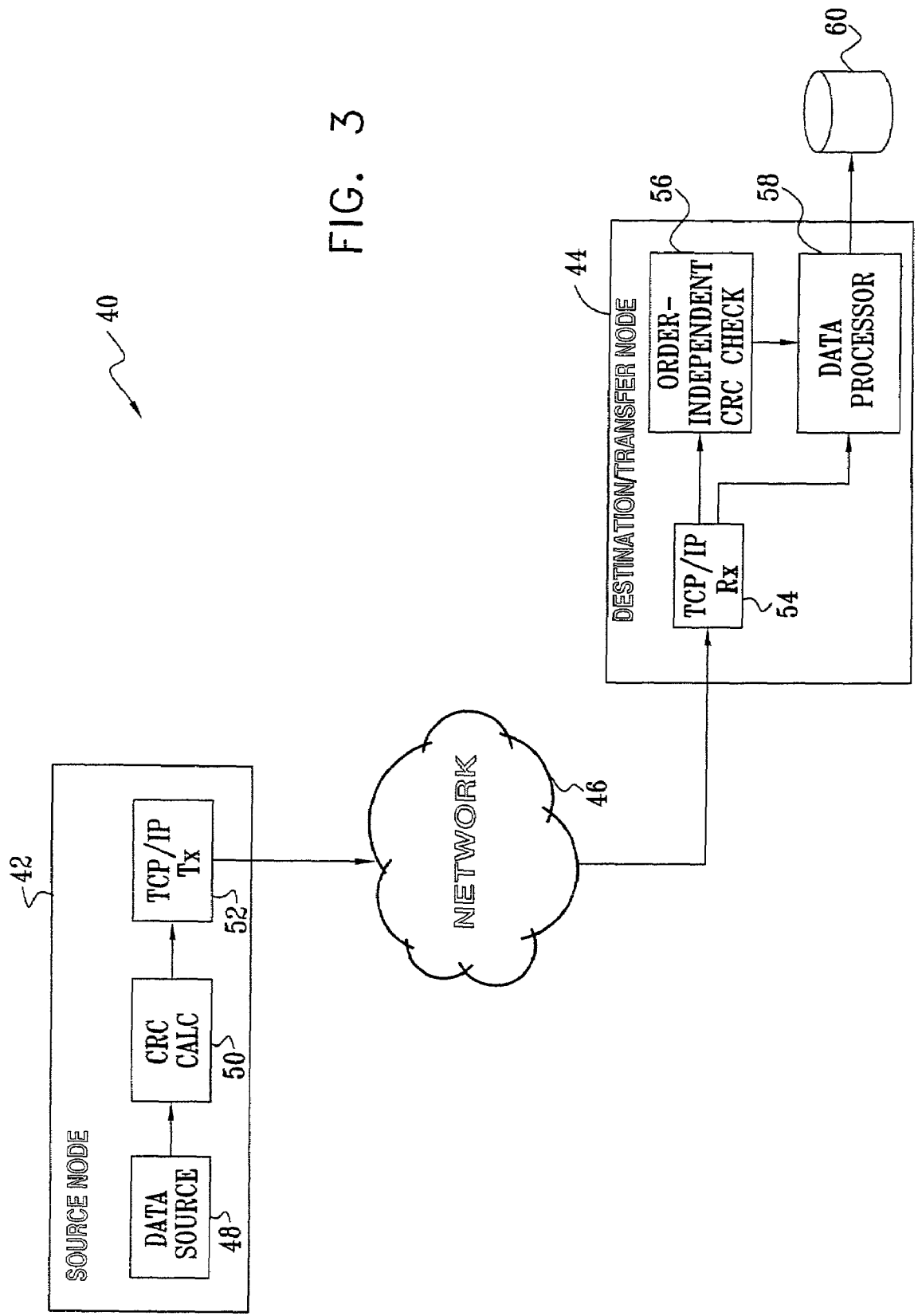
FIG. 3 is a block diagram that schematically illustrates a data communication system, in accordance with a preferred embodiment of the present invention.

Reference is now made to FIG. 3, which is a block diagram that schematically illustrates a data communication system 40, in accordance with a preferred embodiment of the present invention. A data transmitter 42 at a source node conveys data packets over a network 46 to a receiver 44 at a destination node. The source node comprises a data source 48, typically an application, such as an iSCSI application, which generates large blocks of data to be sent to the destination node in accordance with a predetermined protocol. For each block, a CRC calculator 50 in the transmitter, as is known in the art, calculates a CRC based on a predetermined polynomial g(X), and appends the CRC to the data block. A TCP/IP transmit circuit 52 divides each block into TCP segments for transmission over network 46, each segment containing a sub-block of the block prepared by data source 48. Typically, the CRC code for the block is contained in the last segment. Each TCP segment is carried over network 46 by one or more IP data packets to receiver 44.

A TCP/IP receive circuit 54 processes the IP packets and extracts the sub-block of data that is contained in each TCP segment. The data sub-blocks are passed to both a CRC checking circuit 56 and to a data processor 58. Circuit 56 calculates a partial code for each of the sub-blocks, and then combines the partial codes to find the overall CRC for the entire block. The operation of circuit 56 is indifferent to the order in which the sub-blocks are received, as described in detail hereinbelow. Data processor 58 carries out higher-level protocols and performs application-level processing, in accordance with the protocol and application type of data source 48. In iSCSI applications, for example, processor 58 passes the data sub-blocks for writing to a storage medium 60, such as a disk.

Each data block $D(X)$ generated by data source 48 can be represented as a polynomial $D(X)=d_0+d_1X+d_2X^2+\ldots$, wherein the coefficients $d_0, d_1, \ldots$, are the bits of the data block. When broken into sub-blocks $A_0, \ldots, A_F$, $D(X)$ becomes In these expressions, as well as in the description that follows, binary polynomial arithmetic is used, with no carries, as is known in the CRC art.

Equation (1) shows that the CRC of the complete block can be found by calculating the CRC of each of the sub-blocks to give a partial code $CRC(A_I(X))$, multiplying each partial code by the modulo of the respective offset multiplier $X^M$, and then taking the modulo of the product to give a modified partial code for each block. The partial code for each sub-block depends only on the contents of the sub-block itself, and it can therefore be calculated for each sub-block as soon as it is received, even without knowing the position of the sub-block in the overall block. The modified partial codes depend on the offset of each sub-block within the overall block. Depending on the application and protocols used by transmitter 42, the offset information may be provided by receive circuit 54 for each TCP segment or may be determined by data processor 58 for each sub-block as soon as the sub-block is received. Alternatively, data processor 58 may determine the order and offsets of the sub-blocks only after the entire block has been received. In either case, CRC checking circuit 56 has no need to buffer the sub-block data, and need only store the partial codes (or modified partial codes) until the entire block has arrived at receiver 44 and the full block CRC is calculated.

Figure 1:
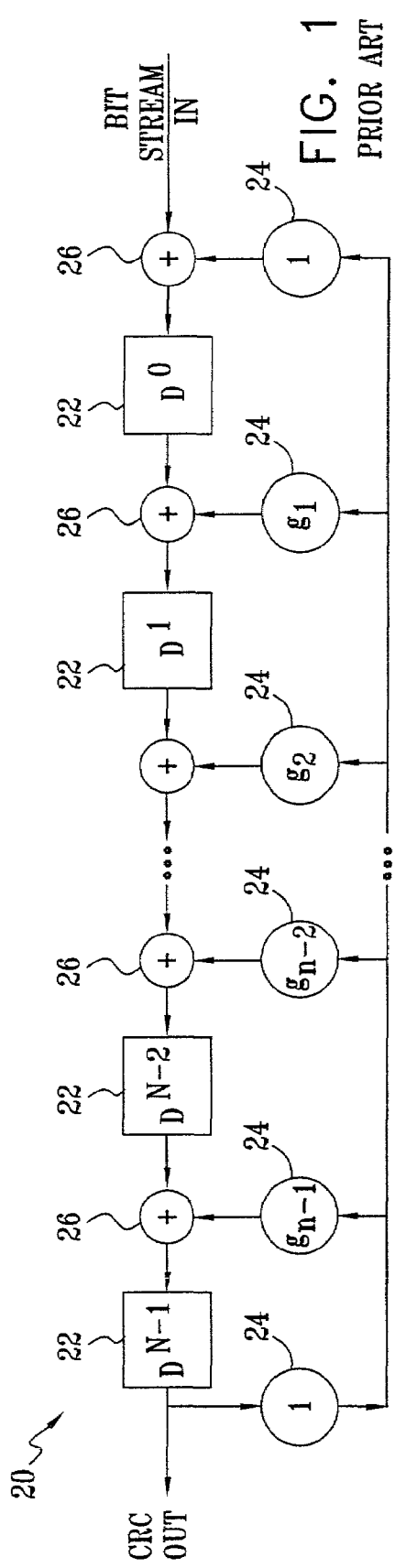
FIG. 1 is a block diagram that schematically illustrates a CRC calculator, as is known in the art.
Figure 4:
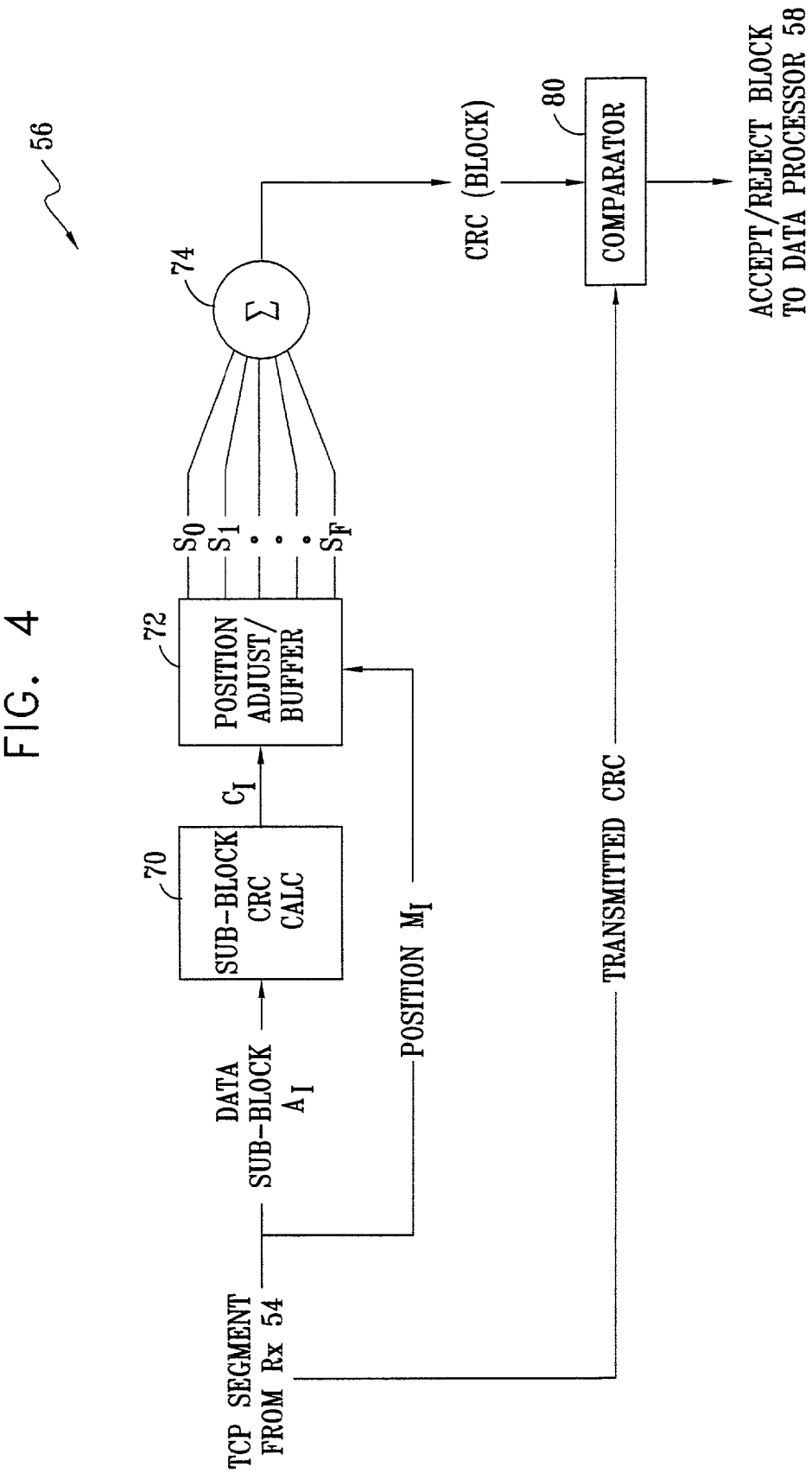
FIG. 4 is a block diagram that schematically illustrates an order-independent CRC checking circuit, in accordance with a preferred embodiment of the present invention.

FIG. 4 is a block diagram that schematically shows details of CRC checking circuit 56, in accordance with a preferred embodiment of the present invention. Each data sub-block $A_I$ extracted from an incoming TCP segment is input to a segment CRC calculator 70, which calculates a corresponding partial code $C_I=CRC(A_I)$. Calculator 70 may be implemented using substantially any CRC implementation scheme known in the art, such as the implementations shown in FIGS. 1 and 2. Preferably, for the sake of efficiency, a table-based implementation is used, such as that illustrated by FIG. 2. Appendix A presents MATLAB code for logic equation generators. These generators produce logical equations which describe the content of the above mentioned tables, in a format suitable for hardware implementation.

Partial codes $C_I$ are input to a position adjustment and buffering circuit 72. When the offset of sub-block $A_I$ within block D is determined, circuit 72 calculates the modified partial code $S_I=(CRC(A(X))*(X^M) \bmod g(X)) \bmod g(X)$ for the block. Circuit 72 stores the values of either $C_I$ or $S_I$ until all of the sub-blocks $A_I$ have been processed. A modulo summer 74 sums the modified partial codes $S_0, \ldots, S_F$ to give the full CRC of block D. In accordance with the principles of polynomial arithmetic, summer 74 outputs the result $S_0$ XOR $S_1$ XOR . . . XOR $S_F$.

A comparator 80 compares the CRC calculated by summer 74 with the CRC appended to the data block at transmitter 42. If the two CRC values match, CRC checking circuit 56 informs data processor 58 that the block can be accepted. If there is a mismatch between the CRC values, the CRC checking circuit informs the data processor that the data block should be rejected. In the exemplary iSCSI application described above, the data in the block will already have been written to storage 60, at least in part. (Preferably, the data are written in the proper sub-block order, based on the respective offsets of the blocks.) If a CRC mismatch is then detected, the data processor typically erases or overwrites the bad data in storage 60.

Figure 5:
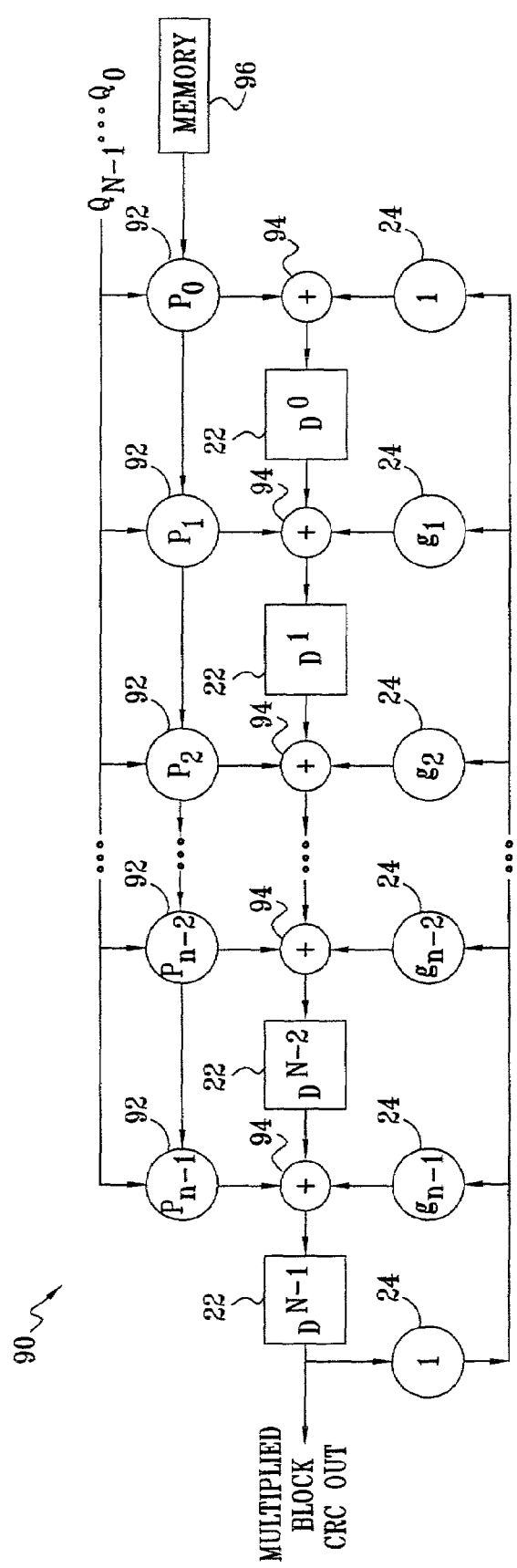
FIG. 5 is a block diagram that schematically illustrates a multiplier circuit used in calculating partial CRC codes for sub-blocks within a data block, in accordance with a preferred embodiment of the present invention.

FIG. 5 is a block diagram that schematically shows a modulo multiplier circuit 90, which can be used to calculate the modified partial codes in position adjustment and buffering circuit 72, in accordance with a preferred embodiment of the present invention. Circuit 90 generates the product $(q(X)*p(X)) \bmod g(X)$, wherein q, p and g are polynomials having respective coefficients $q_0, \ldots, q_{N-1}$, and so forth. In the context of the present embodiment, referring to equation (1), q(X) is CRC(A(X)), while p(X) is the sub-block offset factor $(X^M) \bmod g(X)$. Circuit 90 thus operates on each of the partial codes $C_I$ to generate the corresponding modified partial code $S_I$.

For efficiency of implementation, the sub-block offset M for each sub-block is preferably represented as a binary number with bit values $m_b, \ldots, m_0$. The sub-block offset factor $(X^M) \bmod g(X)$ for each sub-block can then be decomposed into partial offset factors as follows:

$$(X^M) \bmod g(X) = \sum_i m_i (X^{2^i}) \bmod g(X) \quad (2)$$

The modified partial codes $S_I = (CRC(A(X))*(X^M)) \bmod g(X)) \bmod g(X)$ can thus be determined by calculating the product of $(X^{2^i}) \bmod g(X)$ with CRC(A(X)) for each bit position i for which $m_i$ is non-zero in the binary representation of M, and then summing the results.

In order to calculate the products, polynomial coefficients $p_0, \ldots, p_{N-1}$, representing $(X^{2^i}) \bmod g(X)$ for each bit position i, are stored in a memory 96. For each i for which the corresponding $m_i$ is not zero for the given block offset M, the coefficient values $p_0, \ldots, p_{N-1}$ are applied to binary multipliers 92, so as to multiply the values $q_0, \ldots, q_{N-1}$ of CRC(A(X)). Summers 94 add the products of these multiplications to the bit output of circuit 90, fed back through multipliers 24 holding the values $g_0, \ldots, g_{N-1}$ (as in CRC calculator 20, shown in FIG. 1). In this way, the partial code component $S_I^{(i)}$ for bit i is calculated. Position adjustment and buffering circuit 72 adds up the partial code components to give the partial code $S_I$.

Figure 2:
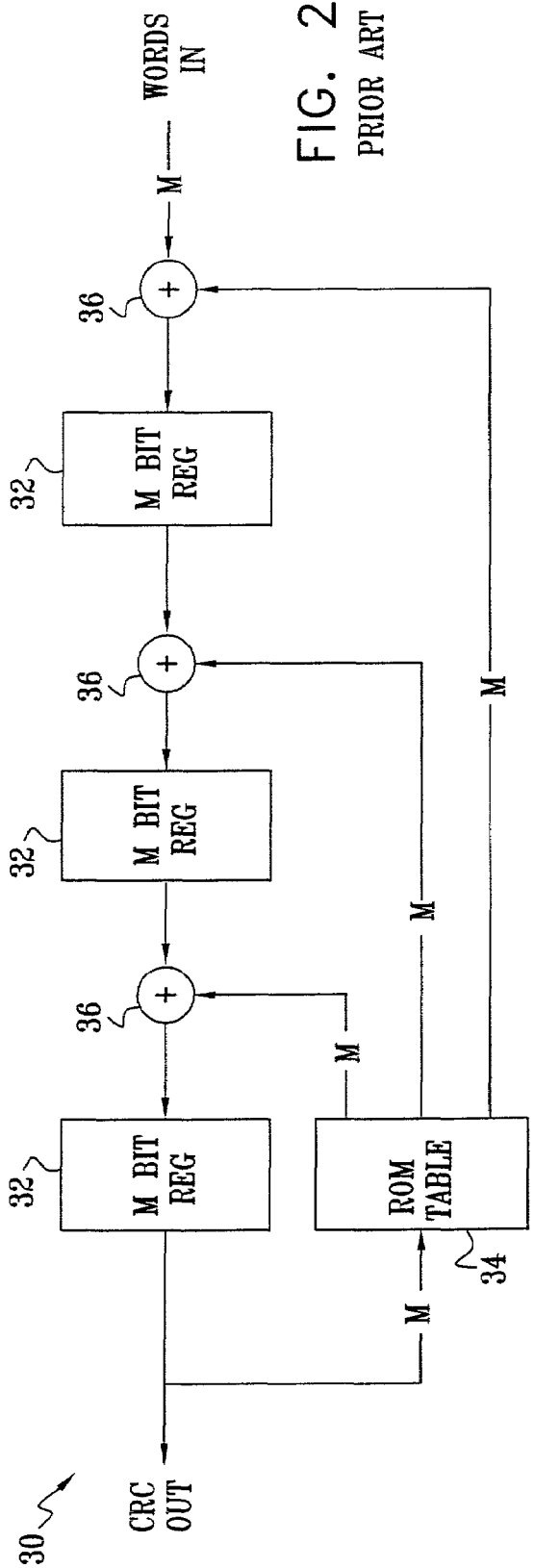
FIG. 2 is a block diagram that schematically illustrates another CRC calculator, likewise known in the art.

Modulo multiplier circuit 90 can be more efficiently implemented in hardware by processing N bits at a time, using a table-based implementation similar to that shown in FIG. 2. Appendix B presents an exemplary implementation of this sort, in the form of a Matlab equation generator that describes the future state of each register 22 in FIG. 5 given the present state of the registers, the polynomial coefficients $p_0, \ldots, p_{N-1}$ and $g_0, \ldots, g_{N-1}$, and the N current bits of $q_0, \ldots, q_{N-1}$.

Appendix C presents an exemplary implementation of an out-of-order CRC processor in Verilog hardware design language. The appendix contains the following two modules:
1. crc_out_of_order
2. crc_out_of_order_block Inputting the code in Appendix C to a suitable Verilog simulator will cause the simulator to generate a circuit suitable for carrying out the function of the order-independent CRC checking circuit shown in FIG. 4. The Verilog code assumes that the CRC on each one of the sub-blocks has been previously calculated. The file crc_out_of_order_block.v contains all the external interfaces required. The block assumes that it receives as inputs the sub-block partial CRC and sub-block offset (in bytes). The block then calculates the combined CRC of the full block.

Although preferred embodiments are described herein specifically with reference to certain communication protocols, such as TCP/IP, and types of error detecting codes, such as CRCs, the principles of the present invention may similarly be applied to data communications using other protocols in which data blocks are fragmented and must be reassembled at the receiver, and using error detecting codes of other types. Furthermore, although the advantages of these preferred embodiments have been described particularly in the context of certain data transfer applications, such as iSCSI-based systems, these applications are mentioned by way of example, and not limitation. The advantages of the present invention in the context of other protocols, coding algorithms and applications will be apparent to those skilled in the art.

It will thus be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

429383S4

APPENDIX A − EQUATION GENERATOR FOR MULTI-BIT CRC

```
% Logic Equation generator for Multibit CRC

% Implementation
% The equation generator is implemented as a production
% rule grammar, the character string variables S0,S1 ...
% etc., each contain a string describing the content of
% the storage  elements they represent, as a function of
% their previous state and the input sequence. The
% variables S0, S1 ... are initialized, to the strings
% s0(t-1), s1(t-1) ... respectively. The variable I
% represents the system input, and sequences the string
% values i0,i1,i2 ... each clock. The system state
% evolves using production rules, for example the state
% of storage element S0 may be determined by the
% production rule S0 -> S15 ^ I, so that the string
% content of S0 is replaced by the string which is a
% concatenation of the strings for S15 with the string ^
% (xor) and with the string contained in I representing
% the current input.  the implementation of the
% production system uses the Matlab function sprintf,
% which does all the string manipulation.
%
% Since it is not possible in Matlab to have a two
% dimensional array of variable length strings, the main
% data structure ss[], is a vector storing in a
% concatenated form, all the strings representing S0,S1
% ... the matrix b[:,:] is used to determine the
% boundaries of each string. The string Sj occupies the
% substring of ss starting in b[j,1] and ending in
% b[j,2];
```

42938S4

```
% Input Variables
M = 8;          % Number of input bits per clock cycle
N = 16;         % Number of stages in the LFSR
a = [1 2];      % index of nonzero feedback taps, 1 = g(0)
2 = g(1) etc.

% calculate feedback polynomial
g = [zeros(1,N) 1];
g(a) = ones(size(a));

% initialize data structures
%
ss  = [];
sst = [];
b   = zeros(N,2);
bt  = zeros(N,2);

% initialize input string
I   = 'i0';

% initialize storage elements S0, S1 ... to s0(t-1),
      s1(t-1) ...
for i=1:N,
      s = sprintf('s%d(t-1)',i-1);
      b(i,1) = length(ss)+1;        % location of first
          char
      b(i,2) = b(i,1) + length(s) - 1; % location of last
          char
      ss = [ss s];

end;
```

42938S4

```
% Equation calculation loop
% iterate production grammar for i = 1:M,    % iterate over number of bits % tap s0
    if g(1) == 1,
        s = sprintf('%s ^ %s',ss(b(N,1):b(N,2)),I);
    else
        s = sprintf('%s',I);
    end sst     = s;
    bt(1,1) = 1;
    bt(1,2) = bt(1,1) + length(s) - 1;

% rest of taps for j = 2:N,   % loop over other taps
        if g(j) == 1,
            s = sprintf('%s ^ %s',ss(b(N,1):b(N,2)),
            ss(b(j-1,1):b(j-1,2)));
        else
            s = sprintf('%s',ss(b(j-1,1):b(j-1,2)));
        end bt(j,1) = length(sst) + 1;
        bt(j,2) = bt(j,1) + length(s) - 1;
        sst     = [sst s];

end;
```

20

42938S4

```
% bit loop house keeping
    ss = sst;
    b  = bt;
    I = sprintf('i%d',i);

% debug info
%          fprintf(1,'\n');
%     for k=1:N,
%          fprintf(1,'s%d(t) =
           %s\n',k-1,ss(b(k,1):b(k,2)));
%     end;
end;

% print report fprintf(1,'equation report:\n');
fprintf(1,'================\n');
fprintf(1,'Number of FFs in LFSR: %d \n', N);
fprintf(1,'Number of input bits/cycle: %d\n',M);
fprintf(1,'Feedback Polynomial: ');
for j=N+1:-1:2,
    if g(j) == 1,
        fprintf(1,'X^%d + ',j-1);
    end;
end;
    if g(1) == 1,
        fprintf(1,'1');
    end;
end;
fprintf(1, '\n\n');

% print equations
```

```
for i=1:N,
    fprintf(1,'s%d(t) = %s\n',i-1,ss(b(i,1):b(i,2)));
end;
```

APPENDIX B – EQUATION GENERATOR FOR FINITE FIELD MULTIPLIER

```
% Logic Equation generator for multi-bit multiplier in
% finite fields

% The equation generator is implemented as a production
% rule grammar.  The character string variables S0,S1 ...
% etc., each contain a string describing the content of
% the storage  elements they represent, as a function of
% their previous state and the input sequence. The
% variables S0, S1 ... are initialized, to the strings
% s0(t-1), s1(t-1) ... respectively. The variable I
% represents the system input, and sequences the string
% values i0,i1,i2 ... at each clock. The system state
% evolves using production rules.  For example, the state
% of storage element S0 may be determined by the
% production rule S0 -> S15 ^ I, so that the string
% content of S0 is replaced by the string which is a
% concatenation of the strings for S15 with the string ^
% (xor) and with the string contained in I representing
% the current input.  The implementation of the
% production system uses the Matlab function sprintf,
% which does all the string manipulation. The taps of the
% of the multiplier polynomial are represented by the
% constants p0,p1 ... which are built into the production
% rules.  Since it is not possible in Matlab to have a
% two dimensional array of variable-length strings, the
```

```
4293884

% main data structure ss[], is a vector storing in a
% concatenated form all the strings representing S0,S1
% ... The matrix b[:,:] is used to determine the
% boundaries of each string. The string Sj occupies the
% substring of ss starting in b[j,1] and ending in
% b[j,2];

M = 8;     % Number of input bits per clock cycle
N = 16;    % Number of stages in the LFSR % feedback polynomial definitions
a = [1 2];    % nonzero feedback taps 1 = g(0), 2 = g(1)

% calculate feedback polynomial
g = [zeros(1,N) 1];
g(a) = ones(size(a));

% initialize data structures
ss  = [];
sst = [];
b   = zeros(N,2);
bt  = zeros(N,2);

I   = 'i0';

for i=1:N,
    s = sprintf('s%d(t-1)',i-1);
    b(i,1) = length(ss)+1;          % location of first
        char
    b(i,2) = b(i,1) + length(s) - 1; % location of last
        char
    ss = [ss s];
```

```
end;

% Equation calculation loop for i = 1:M,    % iterate over number of bits
% tap s0
    if g(1) == 1,
        s = sprintf('%s ^ p0*%s',ss(b(N,1):b(N,2)),I);
    else
        s = sprintf('p0*%s',I);
    end sst      = s;
    bt(1,1)  = 1;
    bt(1,2)  = bt(1,1) + length(s) - 1;

% rest of taps
    for j = 2:N,    % loop over other taps
        if g(j) == 1,
            s = sprintf('%s ^ %s',ss(b(N,1):b(N,2)),
                ss(b(j-1,1):b(j-1,2)));
        else
            s = sprintf('%s',ss(b(j-1,1):b(j-1,2)));
        end
        s = sprintf('%s ^ p%d*%s',s,j-1,I);
            % concatenate multiplier term bt(j,1) = length(sst) + 1;
        bt(j,2) = bt(j,1) + length(s) - 1;
        sst     = [sst s];
```

42938S4

```
end;

% bit loop house keeping
    ss = sst;
    b  = bt;
    I  = sprintf('i%d',i);

% debug info
%       fprintf(1,'\n');
%   for k=1:N,
%       fprintf(1,'s%d(t) = %s\n',k-1,
%           ss(b(k,1):b(k,2)));
%   end;
end;

% print report
fprintf(1,'equation report:\n');
fprintf(1,'=================\n');
fprintf(1,'Number of FFs in LFSR: %d \n', N);
fprintf(1,'Number of input bits/cycle: %d\n',M);
fprintf(1,'Feedback Polynomial: ');
for j=N+1:-1:2,
    if g(j) == 1,
        fprintf(1,'X^%d + ',j-1);
    end;
end;
    if g(1) == 1,
        fprintf(1,'1');
    end;
end;
fprintf(1, '\n\n');
```

42938S4

```
for i=1:N,
    fprintf(1,'s%d(t) = %s\n',i-1,ss(b(i,1):b(i,2)));
end;
```

APPENDIX C - VERILOG IMPLEMENTATION

```verilog
//------------------------------------------------------------
// The material in this file is proprietary to Siliquent
LTD.
//
// Module Name  : crc_out_of_order
//
// Input/Output Description :
// ---------------------
//

`timescale 1 ns / 10 ps module crc_out_of_order(
            // INPUTS
                // system
                  clk,
                  rst_n,
                  scan_mode,
                // Control
                  load,
                  write,
                // Data
                  seed,
                  mask_p,
                  mask_g,
                  data_in,
            // OUTPUTS
                // Data
                  kernel_out
                  );

input           clk;
input           rst_n;
input           scan_mode;
input           load;
input           write;
input           data_in;
input   [15:0]  seed;
input   [15:0]  mask_p;
```

```
input      [15:0]   mask_g;
output     [15:0]   kernel_out;

reg  [15:0]   kernel_out;

wire [15:0]   kernel_in;
wire [15:0]   kernel_in_calc;
wire          kernel_en;

always @(posedge clk or negedge rst_n)
if (~rst_n) kernel_out <= 0;
else if (kernel_en) kernel_out <=#1 kernel_in;

assign kernel_en = write | load;
assign kernel_in = load ? seed : kernel_in_calc;

assign kernel_in_calc = ({16{data_in}} & mask_p) ^
({16{kernel_out[15]}} & mask_g) ^
{kernel_out[14:0],1'b0};

endmodule

//-----------------------------------------------------------
// The material in this file is proprietary to Siliquent LTD.
//
// Module Name   : crc_out_of_order_block
//
// Input/Output Description :
// --------------------
// Number of cycles from start to finish is between 20 to 242
//
// INPUTS :
// start_machine - 1 cycle pulse, active high
// crc_offset - number in bytes
// crc_calc_in - the block crc which was calculated earlier
//
// OUTPUTS :
// finish_machine - 1 cycle pulse, active high; when active crc_calc_out bus is ready
// crc_calc_out - modified crc
//

`timescale 1 ns / 10 ps
```

```
module crc_out_of_order_block(
        // INPUTS
            // system
              clk,
              rst_n,
              scan_mode,
            // Control
              start_machine,
            // Data
              crc_offset,
              crc_calc_in,
        // OUTPUTS
            // Control
              finish_machine,
            // Data
              crc_calc_out
              );

input           clk;
input           rst_n;
input           scan_mode;
input           start_machine;
input   [15:0]   crc_calc_in;
input   [11:0]   crc_offset;

output  [15:0]   crc_calc_out;
output          finish_machine;

reg             finish_machine;
reg     [15:0]   crc_calc_out;
wire    [15:0]   data_out_crc_out_of_order;
reg     [2:0]    state;
reg     [3:0]    crc_offset_bit_counter;
wire            crc_offset_bit;
reg             inc_crc_offset_bit_counter;
reg     [3:0]    work_machine_counter;
reg     [15:0]   mask_p;
reg             start_state_machine;
reg             work_machine;
reg             load_crc_out_of_order;
reg             write_crc_out_of_order;
reg             compute_output;
reg             data_in_crc_out_of_order;
reg             crc_offset_bit_counter_eq_12;

parameter IDLE              = 0,
          START_MACHINE     = 1,
```

```
                LOAD_MACHINE              = 2,
                INC_CRC_OFFSET_BIT_COUNTER = 3,
                WORK_MACHINE              = 4,
                COMPUTE_OUTPUT            = 5;

// OUTPUT REGISTER always @(posedge clk or negedge rst_n)
if (~rst_n) crc_calc_out <= 0;
else if (start_machine) crc_calc_out <=#1 crc_calc_in;
     else if (compute_output) crc_calc_out <=#1
data_out_crc_out_of_order;

// DATA IN CRC OUT OF ORDER MUX always @(crc_calc_out or work_machine_counter)
case (work_machine_counter)
  0: data_in_crc_out_of_order=
crc_calc_out[0];
  1: data_in_crc_out_of_order=
crc_calc_out[1];
  2: data_in_crc_out_of_order=
crc_calc_out[2];
  3: data_in_crc_out_of_order=
crc_calc_out[3];
  4: data_in_crc_out_of_order=
crc_calc_out[4];
  5: data_in_crc_out_of_order=
crc_calc_out[5];
  6: data_in_crc_out_of_order=
crc_calc_out[6];
  7: data_in_crc_out_of_order=
crc_calc_out[7];
  8: data_in_crc_out_of_order=
crc_calc_out[8];
  9: data_in_crc_out_of_order=
crc_calc_out[9];
  10: data_in_crc_out_of_order=
crc_calc_out[10];
  11: data_in_crc_out_of_order=
crc_calc_out[11];
  12: data_in_crc_out_of_order=
crc_calc_out[12];
  13: data_in_crc_out_of_order=
crc_calc_out[13];
  14: data_in_crc_out_of_order=
crc_calc_out[14];
```

```
15: data_in_crc_out_of_order=
crc_calc_out[15];
endcase

// MASK P MUX always @(crc_offset_bit_counter)
case (crc_offset_bit_counter)
  0: mask_p =  16'h4458;  // 2048
  1: mask_p =  16'h881c;  // 1024
  2: mask_p =  16'haa9e;  // 512
  3: mask_p =  16'hfd50;  // 256
  4: mask_p =  16'h36c4;  // 128
  5: mask_p =  16'h13fc;  // 64
  6: mask_p =  16'h8e29;  // 32
  7: mask_p =  16'haefc;  // 16
  8: mask_p =  16'hb861;  // 8
  9: mask_p =  16'h3730;  // 4
 10: mask_p =  16'h1021;  // 2
 11: mask_p =  16'h0100;  // 1
endcase

// WORK MACHINE COUNTER always @(posedge clk or negedge rst_n)
if (~rst_n) work_machine_counter <= 0;
else if (start_state_machine) work_machine_counter <=#1 4'd15;
     else if (work_machine) work_machine_counter <=#1 work_machine_counter -1;

// CRC OFFSET BIT COUNTER always @(posedge clk or negedge rst_n)
if (~rst_n) crc_offset_bit_counter <= 0;
else if (start_machine) crc_offset_bit_counter <=#1 0;
     else if (inc_crc_offset_bit_counter)
crc_offset_bit_counter <=#1 crc_offset_bit_counter +1;

assign crc_offset_bit =
crc_offset[crc_offset_bit_counter];

// STATE MACHINE always @(posedge clk or negedge rst_n)
if (~rst_n) state <= 0;
else
  case (state)
```

```
    IDLE : if (start_machine) state <=#1 START_MACHINE;
    START_MACHINE : if (crc_offset_bit_counter_eq_12) state
<=#1 IDLE;
                else if (crc_offset_bit) state <=#1
LOAD_MACHINE;
                else state <=#1
INC_CRC_OFFSET_BIT_COUNTER;
    LOAD_MACHINE : state <=#1 WORK_MACHINE;
    INC_CRC_OFFSET_BIT_COUNTER : state <=#1 START_MACHINE;
    WORK_MACHINE : if (work_machine_counter==0) state <=#1
COMPUTE_OUTPUT;
    COMPUTE_OUTPUT : state <=#1 INC_CRC_OFFSET_BIT_COUNTER;
  endcase always @(posedge clk or negedge rst_n)
if (~rst_n) finish_machine <= 0;
else finish_machine <=#1 crc_offset_bit_counter_eq_12 &
(state == START_MACHINE);

// STATE MACHINE DECODE always @(state or crc_offset_bit_counter)
begin
  inc_crc_offset_bit_counter =
(state==INC_CRC_OFFSET_BIT_COUNTER);
  start_state_machine = (state==START_MACHINE);
  work_machine = (state==WORK_MACHINE);
  write_crc_out_of_order = (state==WORK_MACHINE);
  load_crc_out_of_order = (state==LOAD_MACHINE);
  compute_output = (state==COMPUTE_OUTPUT);
  crc_offset_bit_counter_eq_12 =
(crc_offset_bit_counter==4'd12);
end

/////////////// crc_out_of_order i_crc_out_of_order(
                // INPUTS
                // system
                    .clk(clk),
                    .rst_n(rst_n),
                    .scan_mode(scan_mode),
                // Control
                    .load(load_crc_out_of_order),
                    .write(write_crc_out_of_order),
                // Data
                    .seed(16'd0),
                    .mask_p(mask_p),
```

42938S4

```
                              .mask_g(16'b0001000000100001),
.data_in(data_in_crc_out_of_order),
            // OUTPUTS
              // Data .kernel_out(data_out_crc_out_of_order)
              );

endmodule
```

What is claimed is:

1. A method for detecting an error in a block of data to which an error detection code has been appended, the block having been divided for transmission over a network into a sequence of sub-blocks, each of the sub-blocks at a respective offset within the block of data, the method comprising:

receiving over the network a series of Transport Control Protocol/Internet Protocol (TCP/IP) data packets containing the sub-blocks in an order that does not necessarily correspond to the sequence;

computing respective partial error detection codes for the sub-blocks in substantially the order in which the sub-blocks are received;

combining the partial error detection codes of the sub-blocks to determine a total error detection code of the block; and comparing the total error detection code to the appended error detection code in order to detect the error.

2. A method according to claim 1, wherein combining the partial error detection codes comprises finding respective offsets of the sub-blocks within the block, and modifying the partial error detection codes responsive to the respective offsets.

3. A method according to claim 1, wherein receiving the sub-blocks comprises receiving the data in accordance with an Internet Small Computer System Interface (iSCSI) protocol.

4. A method according to claim 1, wherein the appended error detection code comprises a cyclic redundancy code (CRC) of the block of data, and wherein comparing the total error detection code to the appended error detection code comprises verifying that the total error detection code is equal to the CRC.

5. A data receiver, for receiving a block of data to which an error detection code has been appended, the block having been divided for transmission over a network into a sequence of sub-blocks, each of the sub-blocks at a respective offset within the block of data, the receiver comprising:

a sub-block receiving circuit, which is adapted to receive over the network a series of Transport Control Protocol/Internet Protocol (TCP/IP) data packets containing the sub-blocks in an order that does not necessarily correspond to the sequence and to extract the sub-blocks from the packets; and an error detection circuit, coupled to compute respective partial error detection codes for the sub-blocks in substantially the order in which the sub-blocks are received, to combine the partial error detection codes of the sub-blocks to determine a total error detection code of the block, and to compare the total error detection code to the appended error detection code in order to detect the error.

6. A receiver according to claim 5, wherein the error detection circuit is adapted to determine respective offsets of the sub-blocks within the block, and to modify the partial error detection codes responsive to the respective offsets.

7. A receiver according to claim 5, wherein the sub-blocks contain data transmitted in accordance with an Internet Small Computer System Interface (iSCSI) protocol.

8. A receiver according to claim 5, wherein the appended error detection code comprises a cyclic redundancy code (CRC) of the block of data, and wherein the error detection circuit is adapted to compare the total error detection code to the appended error detection code so as to verify that the total error detection code is equal to the CRC.

* * * * *